(12) United States Patent
Ku et al.

(10) Patent No.: US 9,997,222 B1
(45) Date of Patent: Jun. 12, 2018

(54) SEMICONDUCTOR DEVICES

(71) Applicant: SK Hynix Inc., Icheon (KR)

(72) Inventors: Sang Hyun Ku, Seongnam (KR); Jae Il Kim, Yongin (KR)

(73) Assignee: SK HYNIX INC., Icheon (KR)

( * ) Notice: Subject to any disclaimer, the term of this patent is extended or adjusted under 35 U.S.C. 154(b) by 0 days. days.

(21) Appl. No.: 15/607,342

(22) Filed: May 26, 2017

(30) Foreign Application Priority Data

Dec. 9, 2016 (KR) .......................... 10-2016-0167361

(51) Int. Cl.
*G11C 7/22* (2006.01)
*G11C 7/10* (2006.01)

(52) U.S. Cl.
CPC ............ *G11C 7/222* (2013.01); *G11C 7/1045* (2013.01); *G11C 7/1063* (2013.01); *G11C 2207/2227* (2013.01)

(58) Field of Classification Search
None
See application file for complete search history.

(56) References Cited

U.S. PATENT DOCUMENTS 6,594,770 B1 * 7/2003 Sato ...................... G06F 1/3203
713/300

FOREIGN PATENT DOCUMENTS

KR    10-2008-0078256 A    8/2008

\* cited by examiner

*Primary Examiner* — James G Norman

(57) ABSTRACT

A semiconductor device includes a flag signal generation circuit and a power-down signal generation circuit. The flag signal generation circuit generates a flag signal which is enabled in response to an operational frequency information signal. The power-down signal generation circuit generates a power-down signal for controlling input of a command in response to the flag signal and a clock enablement signal. A point of time that the power-down signal is generated is adjusted in response to the flag signal.

19 Claims, 11 Drawing Sheets

SEMICONDUCTOR DEVICES

CROSS-REFERENCE TO RELATED APPLICATIONS

The present application claims priority under 35 U.S.C 119(a) to Korean Patent Application No. 10-2016-0167361, filed on Dec. 9, 2016, which is incorporated herein by reference in its entirety.

BACKGROUND

1. Technical Field

Embodiments of the present disclosure relate to semiconductor devices capable of adjusting a point of time when a power-down mode starts.

2. Related Art

A semiconductor device operating in synchronization with a clock signal may include a clock generation circuit that receives an external clock signal and that generates an internal clock signal used in the semiconductor device based on the external clock signal. Typically, the clock generation circuit may be any one of a delay locked loop (DLL) circuit and a phase locked loop (PLL) circuit.

Meanwhile, a semiconductor device may be designed to operate in a power-down mode for reducing power consumption. When the semiconductor device maintains a turn-on state without performing any operations, the semiconductor device may enter the power-down mode to reduce power consumption. For example, a semiconductor memory device among semiconductor devices may enter the power-down mode to prevent unnecessary circuits from operating while data are not inputted to the semiconductor memory device or are not outputted from the semiconductor memory device. In addition, although external electric power is applied to the semiconductor memory device in the power-down mode, the semiconductor memory device does not generate an internal clock signal in the power-down mode in order to reduce power consumption.

SUMMARY

Various embodiments are directed to semiconductor devices capable of adjusting a point of time when a power-down mode starts according to an operation speed.

According to an embodiment, a semiconductor device includes a flag signal generation circuit and a power-down signal generation circuit. The flag signal generation circuit generates a flag signal which is enabled in response to an operational frequency information signal. The power-down signal generation circuit generates a power-down signal for controlling input of a command in response to the flag signal and a clock enablement signal. A point of time that the power-down signal is generated is adjusted in response to the flag signal.

According to another embodiment, a semiconductor device includes a flag signal generation circuit and a power-down signal generation circuit. The flag signal generation circuit generates first to third flag signals in response to an operational frequency information signal. The power-down signal generation circuit generates a power-down signal for controlling input of a command in response to the first to third flag signals and a clock enablement signal. A point of time that the power-down signal is generated is adjusted in response to the first to third flag signals.

According to yet another embodiment, a semiconductor device includes an operational frequency information generation circuit configured to detect a frequency of a clock signal to generate an operational frequency information signal including information on an operation speed, a flag signal generation circuit configured to generate a flag signal which is enabled in response to the operational frequency information signal, and a power-down signal generation circuit configured to generate a power-down signal for controlling input of a command in response to the flag signal and a clock enablement signal. A point of time that the power-down signal is generated is adjusted in response to the flag signal.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
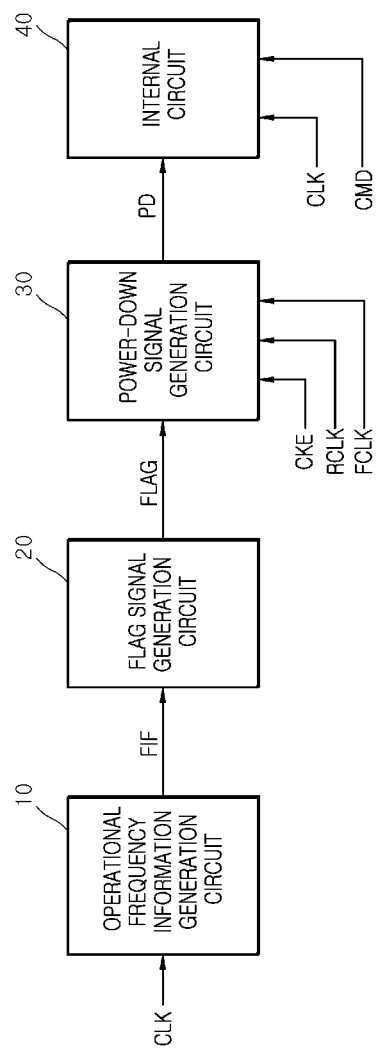
FIG. 1 is a block diagram illustrating a configuration of a semiconductor device according to an embodiment.

FIG. 1 is a block diagram illustrating a configuration of a semiconductor device according to an embodiment. The semiconductor device may include an operational frequency information generation circuit 10, a flag signal generation circuit 20, a power-down signal generation circuit 30, and an internal circuit 40.

The operational frequency information generation circuit 10 may detect a frequency of a clock signal CLK and generate an operational frequency information signal FIF, which includes information on an operation speed, the operation speed being determined based on the detected frequency. The operational frequency information generation circuit 10 may generate the operational frequency information signal FIF, which may include information on a high operation speed or a low operation speed. The operational frequency information generation circuit 10 may detect the toggling of the clock signal CLK during a predetermined period to generate the operational frequency information signal FIF, which includes the information on the operation speed.

The operational frequency information generation circuit 10 may generate the operational frequency information signal FIF using a mode register set (MRS). For example, the operational frequency information generation circuit 10 may generate the operational frequency information signal FIF according to the operation speed of the semiconductor device that is set by the MRS. In an embodiment, when the frequency of the clock signal CLK is greater than or equal to a preset frequency, the operation speed of the semiconductor device is determined to be the high operation speed. On the other hand, when the frequency of the clock signal CLK is less than the preset frequency, the operation speed of the semiconductor device is determined to be the low operation speed.

Although, as illustrated in FIG. 1, the operational frequency information signal FIF is transmitted using a single signal line, the operational frequency information signal FIF may include a plurality of bits to provide various kinds of information according to embodiments.

The flag signal generation circuit 20 may generate a flag signal FLAG, which is enabled or disabled in response to the operational frequency information signal FIF. The flag signal generation circuit 20 may generate the flag signal FLAG, which is enabled when the operational frequency information signal FIF corresponds to one of the high operation speed and the low operation speed. The flag signal generation circuit 20 may generate the flag signal FLAG, which is disabled when the operational frequency information signal FIF corresponds to the other one of the high operation speed and the low operation speed. A logic level of the enabled flag signal FLAG may be set differently according to embodiments. For example, the enabled flag signal FLAG may have a logic "high" level or a logic "low" level.

In this embodiment, the flag signal generation circuit 20 generates the enabled flag signal FLAG when the operational frequency information signal FIF corresponds to the high operation speed, and generates the disabled flag signal FLAG when the operational frequency information signal FIF corresponds to the low operation speed.

The power-down signal generation circuit 30 may generate a power-down signal PD for controlling the input of a command CMD based on the flag signal FLAG, a clock enablement signal CKE, a rising clock signal RCLK, and a falling clock signal FCLK. The power-down signal generation circuit 30 may detect a level transition of the clock enablement signal CKE and generate the power-down signal PD in response to the detected level transition. The power-down signal generation circuit 30 may set a point of time when the power-down signal PD is generated, in response to the flag signal FLAG. The power-down signal generation circuit 30 may delay the clock enablement signal CKE by a first delay time period for generating the power-down signal PD when the flag signal FLAG is enabled. The power-down signal generation circuit 30 may delay the clock enablement signal CKE by a second delay time period for generating the power-down signal PD when the flag signal FLAG is disabled. The second delay time period may be longer than the first delay time period.

The rising clock signal RCLK and the falling clock signal FCLK may be generated by dividing the clock signal CLK. The rising clock signal RCLK and the falling clock signal FCLK may have a frequency that is lower than a frequency of the clock signal CLK. The rising clock signal RCLK may have a phase that is opposite to a phase of the falling clock signal FCLK.

The clock enablement signal CKE may be used to generate an internal clock signal of the semiconductor device by indicating when the semiconductor device enters a power-down mode and terminates the power-down mode.

The internal circuit 40 may perform an internal operation according to a command CMD, which is synchronized with the clock signal CLK, in response to the power-down signal PD. The internal circuit 40 may perform the internal operation according to the command CMD synchronized with the clock signal CLK when the power-down signal PD is disabled. The internal circuit 40 may interrupt the input of the command CMD synchronized with the clock signal CLK when the power-down signal PD is enabled. The internal circuit 40 may enter the power-down mode and terminate generation of the internal clock signal when the power-down signal PD is enabled. The internal circuit 40 may include a memory circuit of a semiconductor device. In an embodiment, the semiconductor device is a volatile memory device or a nonvolatile memory device.

Figure 2:
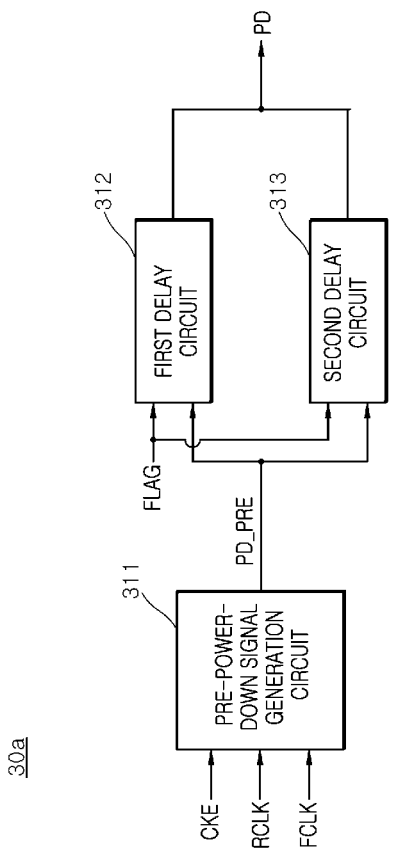
FIG. 2 is a block diagram illustrating a power-down signal generation circuit included in the semiconductor device illustrated in FIG. 1 according to an embodiment.

FIG. 2 is a block diagram illustrating a power-down signal generation circuit 30a included in the semiconductor device of FIG. 1 according to an embodiment. The power-down signal generation circuit 30a may include a pre-power-down signal generation circuit 311, a first delay circuit 312, and a second delay circuit 313.

The pre-power-down signal generation circuit 311 may be synchronized with a rising clock signal RCLK and a falling clock signal FCLK to generate a pre-power-down signal PD_PRE in response to the clock enablement signal CKE. The pre-power-down signal generation circuit 311 may generate the pre-power-down signal PD_PRE, which is enabled or disabled depending on the level transition of the clock enablement signal CKE. The rising clock signal RCLK and the falling clock signal FCLK may be generated by dividing the clock signal CLK. The rising clock signal RCLK and the falling clock signal FCLK may have a frequency that is lower than a frequency of the clock signal CLK. The rising clock signal RCLK may have a phase that is opposite to a phase of the falling clock signal FCLK.

The first delay circuit 312 may delay the pre-power-down signal PD_PRE by the first delay time period to generate the power-down signal PD, in response to the flag signal FLAG. The first delay circuit 312 may delay the pre-power-down signal PD_PRE by the first delay time period to generate the power-down signal PD when the flag signal FLAG is enabled. The first delay circuit 312 may be activated when the flag signal FLAG is enabled and delay the pre-power-down signal PD_PRE by the first delay time period to generate the power-down signal PD.

The second delay circuit 313 may delay the pre-power-down signal PD_PRE by the second delay time period in response to the flag signal FLAG to thereby generate the power-down signal PD. The second delay circuit 313 may delay the pre-power-down signal PD_PRE by the second delay time period when the flag signal FLAG is disabled.

The second delay circuit 313 may be active when the flag signal FLAG is disabled and delay the pre-power-down signal PD_PRE by the second delay time period to generate the power-down signal PD.

Figure 3:
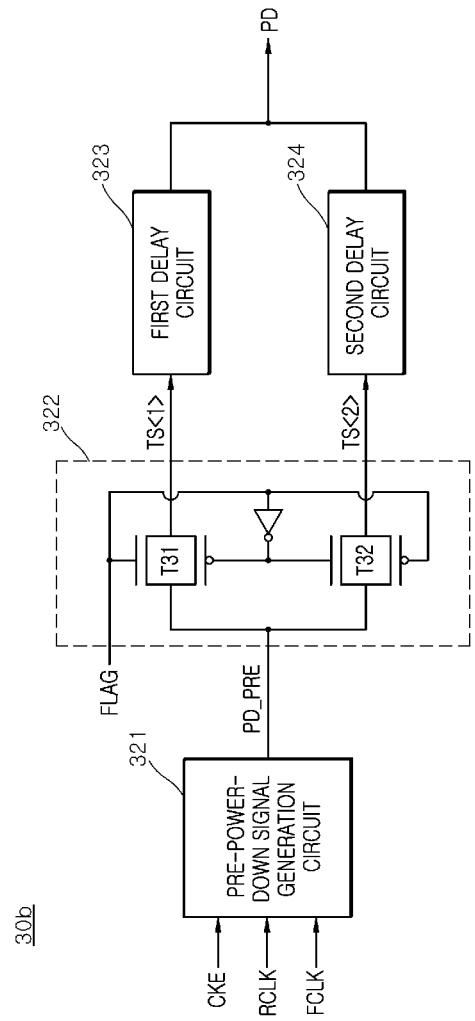
FIG. 3 is a block diagram illustrating a power-down signal generation circuit included in the semiconductor device illustrated in FIG. 1 according to another embodiment.

FIG. 3 is a block diagram illustrating a power-down signal generation circuit 30b included in the semiconductor device of FIG. 1 according to another embodiment. The power-down signal generation circuit 30b may include a pre-power-down signal generation circuit 321, a signal transmission circuit 322, a first delay circuit 323, and a second delay circuit 324.

The pre-power-down signal generation circuit 321 may be synchronized with a rising clock signal RCLK and a falling clock signal FCLK to generate a pre-power-down signal PD_PRE in response to the clock enablement signal CKE. The pre-power-down signal generation circuit 321 may be synchronized with the rising clock signal RCLK and the falling clock signal FCLK to generate the pre-power-down signal PD_PRE, which is enabled or disabled depending on the level transition of the clock enablement signal CKE.

The signal transmission circuit 322 may include a first switching circuit T31 and a second switching circuit T32.

The first switching circuit T31 may include a transistor-type transfer gate. The first switching circuit T31 may output the pre-power-down signal PD_PRE as a first transmission signal TS<1> in response to the flag signal FLAG. The first switching circuit T31 may be turned on to output the pre-power-down signal PD_PRE as the first transmission signal TS<1> when the flag signal FLAG is enabled. When it is enabled, the flag signal FLAG has a logic "high" level.

The second switching circuit T32 may include a transistor-type transfer gate. The second switching circuit T32 may output the pre-power-down signal PD_PRE as a second transmission signal TS<2> in response to the flag signal FLAG. The second switching circuit T32 may be turned on to output the pre-power-down signal PD_PRE as the second transmission signal TS<2> when the flag signal FLAG is disabled. When it is disabled, the flag signal FLAG has a logic "low" level.

As described above, the signal transmission circuit 322 may output the pre-power-down signal PD_PRE as the first transmission signal TS<1> or the second transmission signal TS<2> in response to the flag signal FLAG. That is, the signal transmission circuit 322 may output the pre-power-down signal PD_PRE as the first transmission signal TS<1> when the flag signal FLAG is enabled, and the signal transmission circuit 322 may output the pre-power-down signal PD_PRE as the second transmission signal TS<2> when the flag signal FLAG is disabled.

The first delay circuit 323 may delay the pre-power-down signal PD_PRE by the first delay time period to generate the power-down signal PD. The first delay circuit 323 may delay the pre-power-down signal PD_PRE by the first delay time period and output the delayed pre-power-down signal as the power-down signal PD.

The second delay circuit 324 may delay the pre-power-down signal PD_PRE by the second delay time period to generate the power-down signal PD. The second delay circuit 324 may delay the pre-power-down signal PD_PRE by the second delay time period and output the delayed pre-power-down signal as the power-down signal PD.

Figure 4:
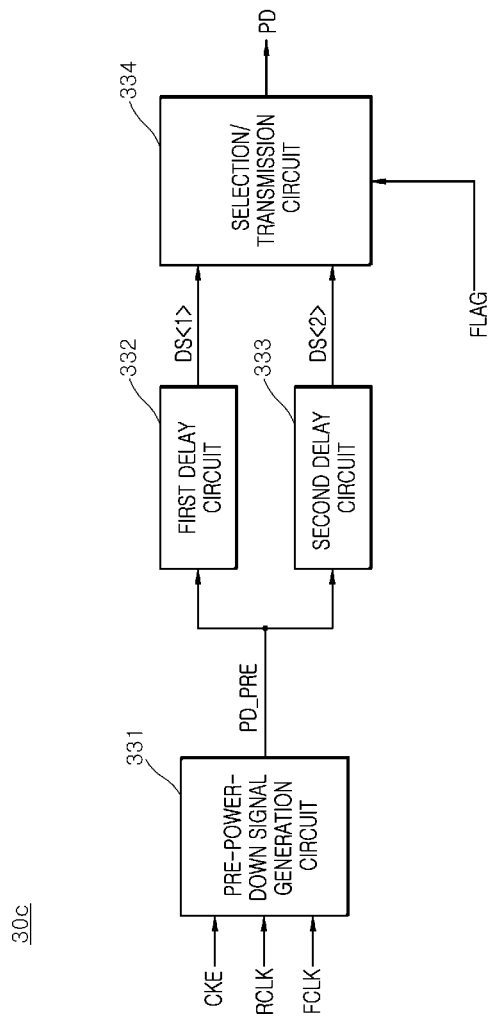
FIG. 4 is a block diagram illustrating a power-down signal generation circuit included in the semiconductor device illustrated in FIG. 1 according to yet another embodiment.

FIG. 4 is a block diagram illustrating a power-down signal generation circuit 30c included in the semiconductor device of FIG. 1 according to yet another embodiment. The power-down signal generation circuit 30c may include a pre-power-down signal generation circuit 331, a first delay circuit 332, a second delay circuit 333, and a selection/transmission circuit 334.

The pre-power-down signal generation circuit 331 may be synchronized with the rising clock signal RCLK and the falling clock signal FCLK to generate the pre-power-down signal PD_PRE in response to the clock enablement signal CKE. The pre-power-down signal generation circuit 331 may be synchronized with the rising clock signal RCLK and the falling clock signal FCLK to generate the pre-power-down signal PD_PRE, which is enabled or disabled depending on the level transition of the clock enablement signal CKE.

The first delay circuit 332 may delay the pre-power-down signal PD_PRE by the first delay time period to generate a first delay signal DS<1>. The first delay circuit 332 may delay the pre-power-down signal PD_PRE by the first delay time period to output the delayed pre-power-down signal as the first delay signal DS<1>.

The second delay circuit 333 may delay the pre-power-down signal PD_PRE by the second delay time period to generate a second delay signal DS<2>. The second delay circuit 333 may delay the pre-power-down signal PD_PRE by the second delay time period to output the delayed pre-power-down signal as the second delay signal DS<2>.

The selection/transmission circuit 334 may output one of the first and second delay signals DS<1:2> as the power-down signal PD in response to the flag signal FLAG. The selection/transmission circuit 334 may output the first delay signal DS<1> as the power-down signal PD when the flag signal FLAG is enabled. The selection/transmission circuit 334 may output the second delay signal DS<2> as the power-down signal PD when the flag signal FLAG is disabled. The selection/transmission circuit 334 may include a multiplexer.

An operation of the semiconductor device having any of the aforementioned configurations illustrated in FIGS. 1 to 4 will be described hereinafter with reference to FIG. 5 in conjunction with examples in which the semiconductor device operates at a high operation speed and a low operation speed.

When the semiconductor device operates at the high operation speed, the operational frequency information generation circuit 10 may detect a frequency of the clock signal CLK to generate the operational frequency information signal FIF, which may include information on the high operation speed. The flag signal generation circuit 20 may generate the flag signal FLAG, which is enabled to have a logic "high" level when the operational frequency information signal FIF includes the information on the high operation speed.

In general, a point of time when the semiconductor device enters the power-down mode may be set by generating the power-down signal PD during a set time period tCPDED from a point of time when a command CMD for entering the power-down mode is inputted. In FIG. 5, the set time period tCPDED may be set to correspond to a time period from a point of time "T2" when the command CMD for entering the power-down mode is inputted to a point of time "T5."

At a point of time "T1," the power-down signal generation circuit 30 may be synchronized with the rising clock signal RCLK and the falling clock signal FCLK to detect a point of time when the clock enablement signal CKE transitions from a logic "high" level to a logic "low" level. That is, the power-down signal generation circuit 30 may detect when a level transition of the clock enablement signal CKE occurs.

At the point of time "T2" following the point of time "T1," the command CMD for entering the power-down mode may be inputted.

At a point of time "T3" following the point of time "T2," the power-down signal generation circuit 30 may generate the power-down signal PD that is enabled by delaying the clock enablement signal CKE by a first delay time period corresponding to a time period from the point of time "T1" to the point of time "T3" in response to the flag signal FLAG, which is enabled to have a logic "high" level.

The internal circuit 40 may interrupt the input of the command CMD synchronized with the clock signal CLK to enter the power-down mode, in response to the power-down signal PD, which is enabled.

Meanwhile, when the semiconductor device operates at the low operation speed, the operational frequency information generation circuit 10 may detect the frequency of the clock signal CLK to generate the operational frequency information signal FIF, which may include information on the low operation speed. The flag signal generation circuit 20 may generate the flag signal FLAG, which is disabled to have a logic "low" level when the operational frequency information signal FIF includes the information on the low operation speed.

At the point of time "T1," the power-down signal generation circuit 30 may be synchronized with the rising clock signal RCLK and the falling clock signal FCLK to detect the point of time when the clock enablement signal CKE transitions from the logic "high" level to the logic "low" level. That is, the power-down signal generation circuit 30 detects when a level transition of the clock enablement signal CKE occurs.

At the point of time "T2," the command CMD for entering the power-down mode may be inputted.

At the point of time "T4" following the point of time "T3," the power-down signal generation circuit 30 may generate the power-down signal PD, which is enabled by delaying the clock enablement signal CKE by a second delay time period corresponding to a time period from the point of time "T1" to the point of time "T4," in response to the flag signal FLAG, which is disabled and has a logic "low" level.

The internal circuit 40 may interrupt the input of the command CMD synchronized with the clock signal CLK to enter the power-down mode, in response to the power-down signal PD, which is enabled.

Figure 5:
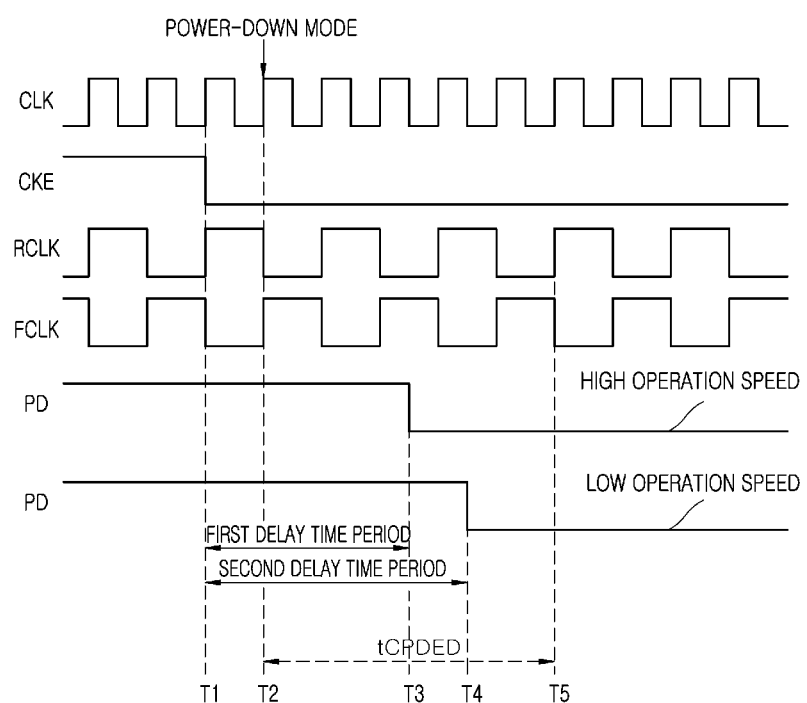
FIG. 5 is a timing diagram illustrating an operation of the semiconductor device illustrated in FIG. 1 according to an embodiment.

In the embodiment shown in FIG. 5, the point of time "T5" follows the point of time "T4."

As described above, the semiconductor devices according to the embodiments shown in FIGS. 1 to 5 may control a delay time period of the power-down signal PD according to two different operation speeds of the semiconductor devices in order to adjust a point of time when the semiconductor device enter the power-down mode according to the operation speed of the semiconductor devices.

Figure 6:
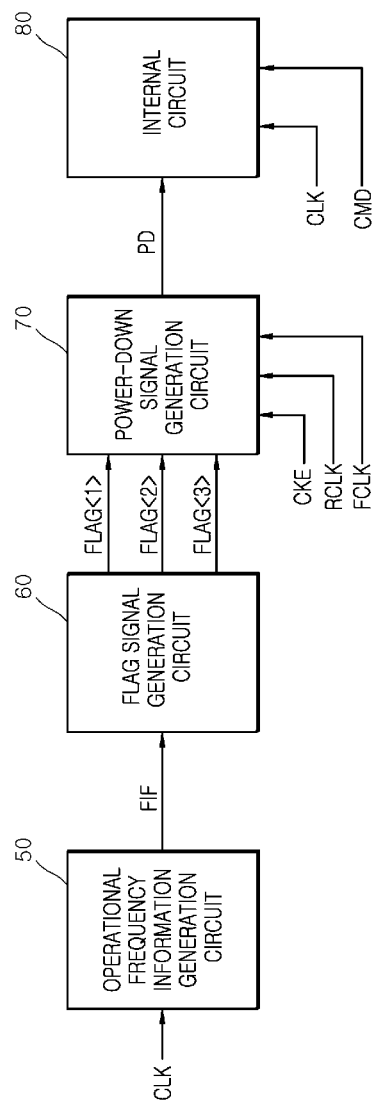
FIG. 6 is a block diagram illustrating a configuration of a semiconductor device according to another embodiment.

FIG. 6 is a block diagram illustrating a configuration of a semiconductor device according to another embodiment. The semiconductor device may include an operational frequency information generation circuit 50, a flag signal generation circuit 60, a power-down signal generation circuit 70, and an internal circuit 80.

The operational frequency information generation circuit 50 may detect a frequency of a clock signal CLK and generate an operational frequency information signal FIF, which includes information on an operation speed, the operation speed being determined based on the detected frequency. The operational frequency information generation circuit 50 may generate the operational frequency information signal FIF, which includes information on a high operation speed, a normal operation speed, or a low operation speed. The operational frequency information generation circuit 50 may detect the toggling of the clock signal CLK during a predetermined time period to generate the operational frequency information signal FIF, which includes the information on the operation speed.

The operational frequency information generation circuit 50 may generate the operational frequency information signal FIF using a mode register set (MRS). For example, the operational frequency information generation circuit 50 may generate the operational frequency information signal FIF according to the operation speed of the semiconductor device, which is set by the MRS. In an embodiment, when the frequency of the clock signal CLK is greater than or equal to a first preset frequency, the operation speed of the semiconductor device is determined to be the high operation speed. When the frequency of the clock signal CLK is less than the first preset frequency and greater than or equal to a second preset frequency, the operation speed of the semiconductor device is determined to be the normal operation speed. When the frequency of the clock signal CLK is less than the second preset frequency, the operation speed of the semiconductor device is determined to be the low operation speed. The first preset frequency is higher than the second preset frequency.

Although the operational frequency information signal FIF is illustrated to be transmitted using a single signal line in FIG. 6, the operational frequency information signal FIF may include a plurality of bits to provide various kinds of information according to embodiments.

The flag signal generation circuit 60 may generate first to third flag signals FLAG<1:3>, each of which is enabled or disabled in response to the operational frequency information signal FIF. The flag signal generation circuit 60 may generate the first flag signal FLAG<1>, which is enabled when the operational frequency information signal FIF corresponds to the high operation speed. The flag signal generation circuit 60 may generate the second flag signal FLAG<2>, which is enabled when the operational frequency information signal FIF corresponds to the normal operation speed. The flag signal generation circuit 60 may generate the third flag signal FLAG<3>, which is enabled when the operational frequency information signal FIF corresponds to the low operation speed. A logic level of each of the enabled first to third flag signals FLAG<1:3> may be set differently according to embodiments. For example, the enabled first to third flag signals FLAG<1:3> may have a logic "high" level or a logic "low" level.

The power-down signal generation circuit 70 may generate a power-down signal PD for controlling the input of a command CMD based on the first to third flag signals FLAG<1:3>, a clock enablement signal CKE, a rising clock signal RCLK, and a falling clock signal FCLK. The power-down signal generation circuit 70 may detect level transition of the clock enablement signal CKE and generate the power-down signal PD in response to the detected level transition. The power-down signal generation circuit 70 may set a point of time when the power-down signal PD is generated, in response to the first to third flag signals FLAG<1:3>. The power-down signal generation circuit 70 may delay the clock enablement signal CKE by a first delay time period to generate the power-down signal PD when the first flag signal FLAG<1> is enabled. The power-down signal generation circuit 70 may delay the clock enablement signal CKE by a second delay time period to generate the power-down signal PD when the second flag signal FLAG<2> is enabled. The power-down signal generation circuit 70 may delay the clock enablement signal CKE by a third delay time period to generate the power-down signal PD when the third flag signal FLAG<3> is enabled. The second delay time period may be longer than the first delay time period, and the third delay time period may be longer than the second delay time period.

The internal circuit 80 may perform an internal operation according to the command CMD, the command CMD being synchronized with the clock signal CLK. The internal circuit 80 may perform the internal operation according to the command CMD synchronized with the clock signal CLK when the power-down signal PD is disabled. The internal circuit 80 may interrupt the input of the command CMD when the power-down signal PD is enabled. The internal circuit 80 may enter the power-down mode and terminate generation of the internal clock signal when the power-down signal PD is enabled. The internal circuit 80 may include a memory circuit of a semiconductor device. In an embodiment, the semiconductor device is a volatile memory device or a nonvolatile memory device.

Figure 7:
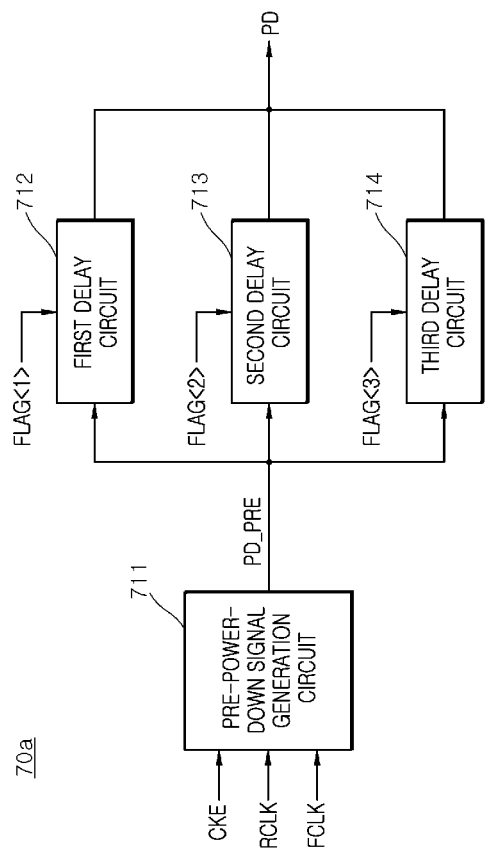
FIG. 7 is a block diagram illustrating a power-down signal generation circuit included in the semiconductor device illustrated in FIG. 6 according to an embodiment.

FIG. 7 is a block diagram illustrating a power-down signal generation circuit 70a included in the semiconductor device of FIG. 6 according to an embodiment. The power-down signal generation circuit 70a may include a pre-power-down signal generation circuit 711, a first delay circuit 712, a second delay circuit 713, and a third delay circuit 714.

The pre-power-down signal generation circuit 711 may be synchronized with a rising clock signal RCLK and a falling clock signal FCLK to generate a pre-power-down signal PD_PRE in response to the clock enablement signal CKE. The pre-power-down signal generation circuit 711 may generate the pre-power-down signal PD_PRE, which is enabled or disabled depending on the level transition of the clock enablement signal CKE. The rising clock signal RCLK and the falling clock signal FCLK may be generated by dividing the clock signal CLK. The rising clock signal RCLK and the falling clock signal FCLK may have a frequency that is lower than a frequency of the clock signal CLK. The rising clock signal RCLK may have a phase that is opposite to a phase of the falling clock signal FCLK.

The first delay circuit 712 may delay the pre-power-down signal PD_PRE by the first delay time period to generate the power-down signal PD, in response to the first flag signal FLAG<1>. The first delay circuit 712 may delay the pre-power-down signal PD_PRE by the first delay time period to generate the power-down signal PD when the first flag signal FLAG<1> is enabled. The first delay circuit 712 may be activated when the first flag signal FLAG<1> is enabled and delay the pre-power-down signal PD_PRE by the first delay time period to generate the power-down signal PD.

The second delay circuit 713 may delay the pre-power-down signal PD_PRE by the second delay time period to generate the power-down signal PD, in response to the second flag signal FLAG<2>. The second delay circuit 713 may delay the pre-power-down signal PD_PRE by the second delay time period to generate the power-down signal PD when the second flag signal FLAG<2> is enabled. The second delay circuit 713 may be activated when the second flag signal FLAG<2> is enabled and delay the pre-power-down signal PD_PRE by the second delay time period to generate the power-down signal PD.

The third delay circuit 714 may delay the pre-power-down signal PD_PRE by the third delay time period to generate the power-down signal PD, in response to the third flag signal FLAG<3>. The third delay circuit 714 may delay the pre-power-down signal PD_PRE by the third delay time period to generate the power-down signal PD when the third flag signal FLAG<3> is enabled. The third delay circuit 714 may be activated when the third flag signal FLAG<3> is enabled and delay the pre-power-down signal PD_PRE by the third delay time period to generate the power-down signal PD.

Figure 8:
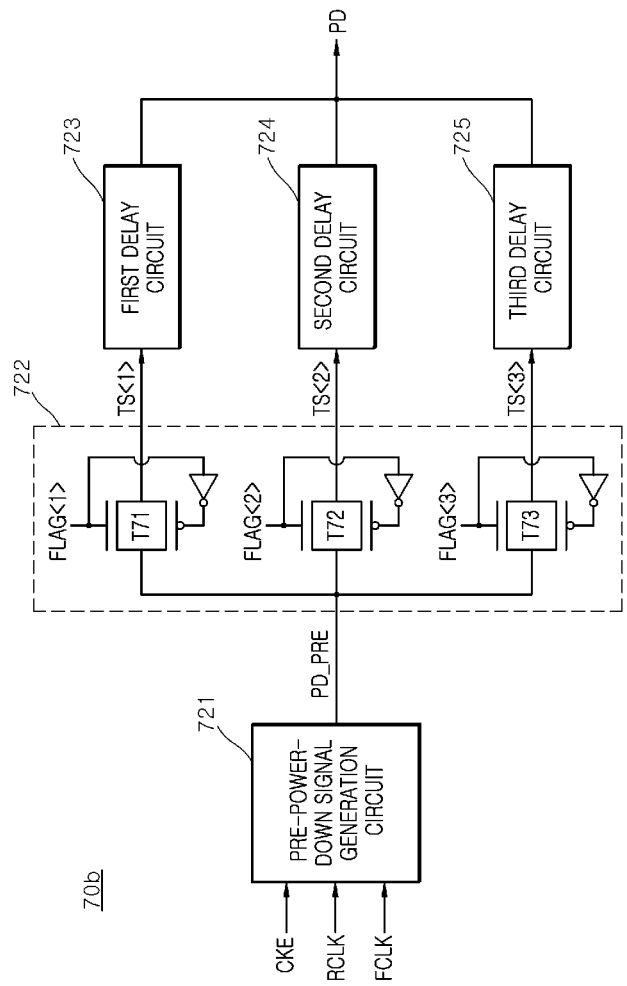
FIG. 8 is a block diagram illustrating a power-down signal generation circuit included in the semiconductor device illustrated in FIG. 6 according to another embodiment.

FIG. 8 is a block diagram illustrating a power-down signal generation circuit 70b included in the semiconductor device of FIG. 6 according to another embodiment. The power-down signal generation circuit 70b may include a pre-power-down signal generation circuit 721, a signal transmission circuit 722, a first delay circuit 723, a second delay circuit 724, and a third delay circuit 725.

The pre-power-down signal generation circuit 721 may be synchronized with a rising clock signal RCLK and a falling clock signal FCLK to generate a pre-power-down signal PD_PRE in response to the clock enablement signal CKE. The pre-power-down signal generation circuit 721 may be synchronized with the rising clock signal RCLK and the falling clock signal FCLK to generate the pre-power-down signal PD_PRE, which is enabled or disabled depending on the level transition of the clock enablement signal CKE.

The signal transmission circuit 722 may include a first switching circuit T71, a second switching circuit T72, and a third switching circuit T73.

The first switching circuit T71 may include a transistor-type transfer gate. The first switching circuit T71 may output the pre-power-down signal PD_PRE as a first transmission signal TS<1> in response to the first flag signal FLAG<1>. The first switching circuit T71 may be turned on to output the pre-power-down signal PD_PRE as the first transmission signal TS<1> when the first flag signal FLAG<1> is enabled. When it is enabled, the first flag signal FLAG<1> has a logic "high" level.

The second switching circuit T72 may include a transistor-type transfer gate. The second switching circuit T72 may output the pre-power-down signal PD_PRE as a second transmission signal TS<2> in response to the second flag signal FLAG<2>. The second switching circuit T72 may be turned on to output the pre-power-down signal PD_PRE as the second transmission signal TS<2> when the second flag signal FLAG<2> is enabled. When it is enabled, the second flag signal FLAG<2> has a logic "high" level.

The third switching circuit T73 may include a transistor-type transfer gate. The third switching circuit T73 may output the pre-power-down signal PD_PRE as a third transmission signal TS<3> in response to the third flag signal FLAG<3>. The third switching circuit T73 may be turned on to output the pre-power-down signal PD_PRE as the third transmission signal TS<3> when the third flag signal FLAG<3> is enabled. When it is enabled, the third flag signal FLAG<3> has a logic "high" level.

As described above, the signal transmission circuit 722 may output the pre-power-down signal PD_PRE as the first transmission signal TS<1> in response to the first flag signal FLAG<1>, which is enabled. The signal transmission circuit 722 may output the pre-power-down signal PD_PRE as the second transmission signal TS<2> in response to the second flag signal FLAG<2>, which is enabled. The signal transmission circuit 722 may output the pre-power-down signal PD_PRE as the third transmission signal TS<3> in response to the third flag signal FLAG<3>, which is enabled.

The first delay circuit 723 may delay the pre-power-down signal PD_PRE by the first delay time period to generate the power-down signal PD. The first delay circuit 723 may delay the pre-power-down signal PD_PRE by the first delay time period to output the delayed pre-power-down signal as the power-down signal PD.

The second delay circuit 724 may delay the pre-power-down signal PD_PRE by the second delay time period to generate the power-down signal PD. The second delay circuit 724 may delay the pre-power-down signal PD_PRE by the second delay time period to output the delayed pre-power-down signal as the power-down signal PD.

The third delay circuit 725 may delay the pre-power-down signal PD_PRE by the third delay time period to generate the power-down signal PD. The third delay circuit 725 may delay the pre-power-down signal PD_PRE by the third delay time period to output the delayed pre-power-down signal as the power-down signal PD.

Figure 9:
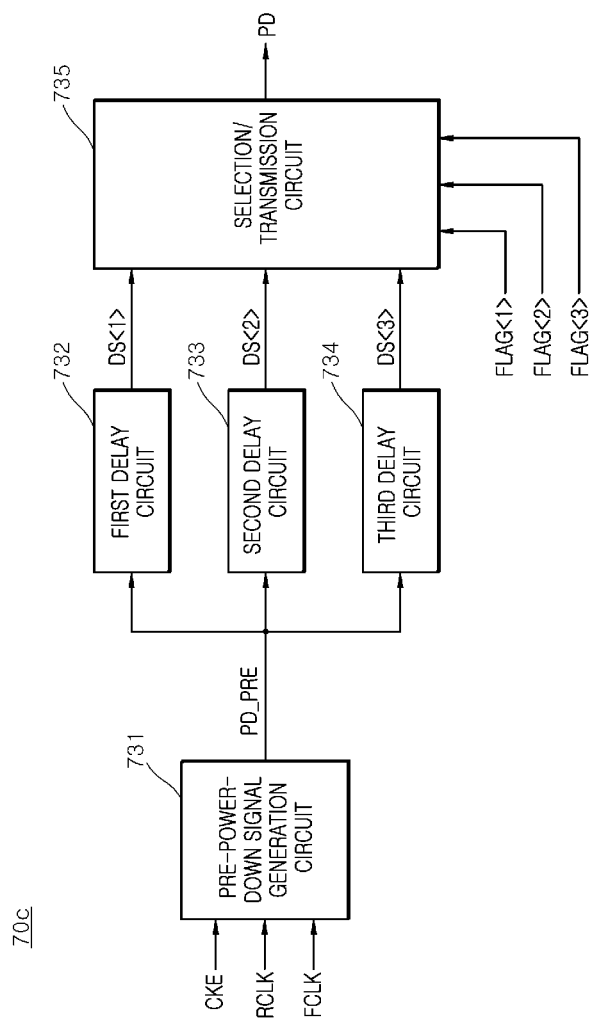
FIG. 9 is a block diagram illustrating a power-down signal generation circuit included in the semiconductor device illustrated in FIG. 6 according to yet another embodiment.

FIG. 9 is a block diagram illustrating a power-down signal generation circuit 70c included in the semiconductor device of FIG. 6 according to yet another embodiment. The power-down signal generation circuit 70c may include a pre-power-down signal generation circuit 731, a first delay circuit 732, a second delay circuit 733, a third delay circuit 734, and a selection/transmission circuit 735.

The pre-power-down signal generation circuit 731 may be synchronized with a rising clock signal RCLK and a falling clock signal FCLK to generate a pre-power-down signal PD_PRE in response to the clock enablement signal CKE. The pre-power-down signal generation circuit 731 may be synchronized with the rising clock signal RCLK and the falling clock signal FCLK to generate the pre-power-down signal PD_PRE, which is enabled or disabled depending on the level transition of the clock enablement signal CKE.

The first delay circuit 732 may delay the pre-power-down signal PD_PRE by the first delay time period to generate a first delay signal DS<1>. The first delay circuit 732 may delay the pre-power-down signal PD_PRE by the first delay time period to output the delayed pre-power-down signal as the first delay signal DS<1>.

The second delay circuit 733 may delay the pre-power-down signal PD_PRE by the second delay time period to generate a second delay signal DS<2>. The second delay circuit 733 may delay the pre-power-down signal PD_PRE by the second delay time period to output the delayed pre-power-down signal as the second delay signal DS<2>.

The third delay circuit 734 may delay the pre-power-down signal PD_PRE by the third delay time period to generate a third delay signal DS<3>. The third delay circuit 734 may delay the pre-power-down signal PD_PRE by the third delay time period to output the delayed pre-power-down signal as the third delay signal DS<3>.

The selection/transmission circuit 735 may output one of the first to third delay signals DS<1:3> as the power-down signal PD in response to the first to third flag signals FLAG<1:3>. The selection/transmission circuit 735 may output the first delay signal DS<1> as the power-down signal PD when the first flag signal FLAG<1> is enabled. The selection/transmission circuit 735 may output the second delay signal DS<2> as the power-down signal PD when the second flag signal FLAG<2> is enabled. The selection/transmission circuit 735 may output the third delay signal DS<3> as the power-down signal PD when the third flag signal FLAG<3> is enabled. The selection/transmission circuit 735 may include a multiplexer.

An operation of the semiconductor device having any of the configurations illustrated in FIGS. 6 to 9 will be described hereinafter with reference to FIG. 10 in conjunction with examples in which the semiconductor device operates at a high operation speed, a normal operation speed, and a low operation speed.

First, when the semiconductor device operates at the high operation speed, the operational frequency information generation circuit 50 may detect a frequency of the clock signal CLK to generate the operational frequency information signal FIF, which may include information on the high operation speed. The flag signal generation circuit 60 may generate the first flag signal FLAG<1>, which is enabled to have a logic "high" level when the operational frequency information signal FIF includes the information on the high operation speed.

In general, a point of time when the semiconductor device enters the power-down mode may be set by generating the power-down signal PD during a set time period tCPDED from a point of time when a command CMD for entering the power-down mode is inputted. In FIG. 10, the set time period tCPDED may be set to correspond to a time period from a point of time "T12" when the command CMD for entering the power-down mode is inputted to a point of time "T16."

At a point of time "T11," the power-down signal generation circuit 70 may be synchronized with the rising clock signal RCLK and the falling clock signal FCLK to detect a point of time when the clock enablement signal CKE transitions from a logic "high" level to a logic "low" level. That is, the power-down signal generation circuit 70 may detect when a level transition of the clock enablement signal CKE occurs.

At the point of time "T12" following the point of time "T11," the command CMD for entering the power-down mode may be inputted.

At a point of time "T13" following the point of time "T12," the power-down signal generation circuit 70 may generate the power-down signal PD, which is enabled by delaying the clock enablement signal CKE by the first delay time period corresponding to a time period from the point of time "T11" to the point of time "T13," in response to the first flag signal FLAG<1>, which is enabled to have a logic "high" level.

The internal circuit 80 may interrupt the input of the command CMD synchronized with the clock signal CLK to enter the power-down mode, in response to the power-down signal PD.

Next, when the semiconductor device operates at the normal operation speed, the operational frequency information generation circuit 50 may detect the frequency of the clock signal CLK to generate the operational frequency information signal FIF, which may include information on the normal operation speed. The flag signal generation circuit 60 may generate the second flag signal FLAG<2>, which is enabled to have a logic "high" level when the operational frequency information signal FIF includes the information on the normal operation speed.

At the point of time "T11," the power-down signal generation circuit 70 may be synchronized with the rising clock signal RCLK and the falling clock signal FCLK to detect the point of time when the clock enablement signal CKE transitions from the logic "high" level to the logic "low" level. That is, the power-down signal generation circuit 70 may detect when a level transition of the clock enablement signal CKE occurs.

At the point of time "T12," the command CMD for entering the power-down mode may be inputted.

At a point of time "T14" following the point of time "T13," the power-down signal generation circuit 70 may generate the power-down signal PD, which is enabled by delaying the clock enablement signal CKE by the second delay time period corresponding to a time period from the point of time "T11" to the point of time "T14," in response to the second flag signal FLAG<2>, which is enabled to have a logic "high" level.

The internal circuit 80 may interrupt the input of the command CMD synchronized with the clock signal CLK to enter the power-down mode, in response to the power-down signal PD, which is enabled.

Next, when the semiconductor device operates at the low operation speed, the operational frequency information generation circuit 50 may detect the frequency of the clock signal CLK to generate the operational frequency information signal FIF, which may include information on the low operation speed. The flag signal generation circuit 60 may generate the third flag signal FLAG<3>, which is enabled to have a logic "high" level when the operational frequency information signal FIF includes the information on the low operation speed.

At the point of time "T11," the power-down signal generation circuit 70 may be synchronized with the rising clock signal RCLK and the falling clock signal FCLK to detect the point of time when the clock enablement signal CKE transitions from the logic "high" level to the logic "low" level. That is, the power-down signal generation circuit 70 may detect when a level transition of the clock enablement signal CKE occurs.

At the point of time "T12," the command CMD for entering the power-down mode may be inputted.

At the point of time "T15" following the point of time "T14," the power-down signal generation circuit 70 may generate the power-down signal PD that is enabled by delaying the clock enablement signal CKE by the third delay time period corresponding to a time period from the point of time "T11" to the point of time "T15," in response to the third flag signal FLAG<3>, which is enabled to have a logic "high" level.

The internal circuit 80 may interrupt the input of the command CMD synchronized with the clock signal CLK to enter the power-down mode, in response to the power-down signal PD, which is enabled.

Figure 10:
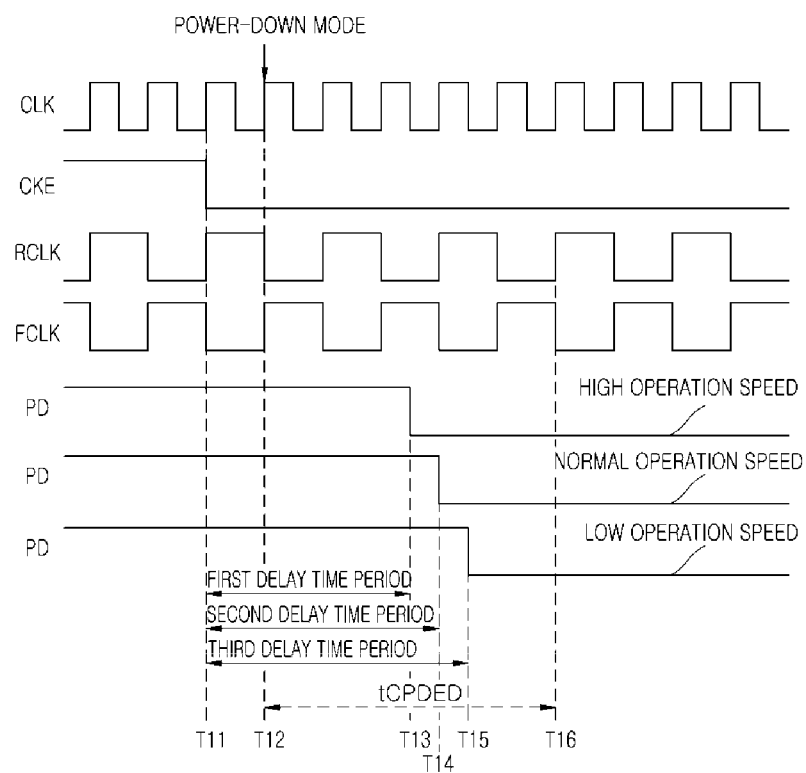
FIG. 10 is a timing diagram illustrating an operation of the semiconductor device illustrated in FIG. 6 according to an embodiment.

In the embodiment shown in FIG. 10, the point of time "T16" follows the point of time "T15."

As described above, the semiconductor devices according to the embodiments shown in FIGS. 6 to 10 may control a delay time period of the power-down signal PD according to three different operation speeds of the semiconductor devices in order to adjust a point of time when the semiconductor device enters the power-down mode according to the operation speed of the semiconductor devices.

Figure 11:
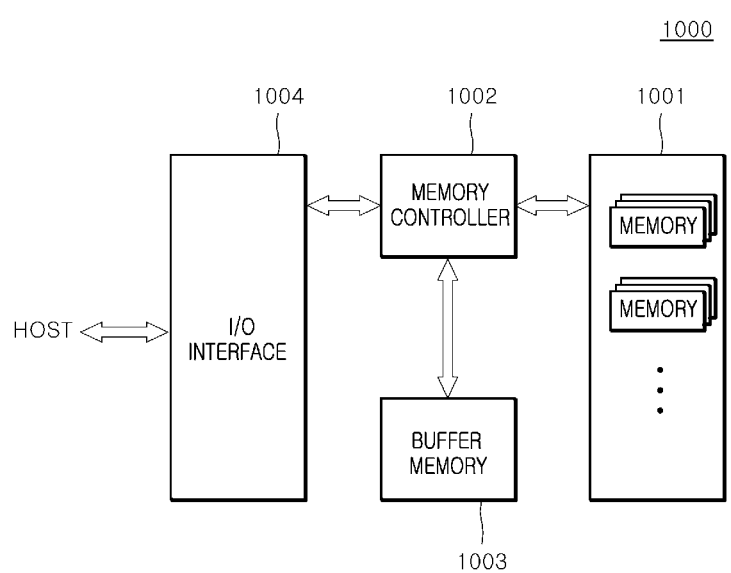
FIG. 11 is a block diagram illustrating a configuration of an electronic system employing at least one of the semiconductor devices illustrated in FIGS. 1 to 10.

At least one of the semiconductor devices described with reference to FIGS. 1 to 10 may be applied to an electronic system that includes a memory system, a graphic system, a computing system, a mobile system, or the like. For example, as illustrated in FIG. 11, an electronic system 1000 according an embodiment may include a data storage circuit 1001, a memory controller 1002, a buffer memory 1003, and an input/output (I/O) interface 1004.

The data storage circuit 1001 may store data transmitted from the memory controller 1002, or may read and output the stored data to the memory controller 1002, in response to a control signal generated by the memory controller 1002. The data storage circuit 1001 may include at least one of the semiconductor devices illustrated in FIGS. 1 and 6. Meanwhile, the data storage circuit 1001 may include a nonvolatile memory that can retain stored data even when power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command from an external device (e.g., a host device) through the I/O interface 1004, and may decode the command received from the host device to control an operation for storing data in the data storage circuit 1001 or the buffer memory 1003, or to control an operation for outputting the data stored in the data storage circuit 1001 or the buffer memory 1003. Although FIG. 11 illustrates the memory controller 1002 with a single block, the memory controller 1002 may include a first controller for controlling the data storage circuit 1001 comprised of a nonvolatile memory and a second controller for controlling the buffer memory 1003 comprised of a volatile memory.

The buffer memory 1003 may temporarily store data, which are processed by the memory controller 1002. That is, the buffer memory 1003 may temporarily store data, which are read from or to be stored in the data storage circuit 1001. The buffer memory 1003 may store the data, which are transmitted from the memory controller 1002, in response to a control signal generated by the memory controller 1002. The buffer memory 1003 may read out data from the data storage circuit 1001, temporarily store the read-out data, and output the read-out data to the memory controller 1002. The buffer memory 1003 may include a volatile memory such as a dynamic random access memory (DRAM), a mobile DRAM, a static random access memory (SRAM), or the like.

The I/O interface 1004 may physically and electrically connect the memory controller 1002 to the external device (i.e., the host device). Thus, the memory controller 1002 may receive control signals and data supplied by the external device (i.e., the host device) through the I/O interface 1004, and may output data from the memory controller 1002 to the external device (i.e., the host device) through the I/O interface 1004. That is, the electronic system 1000 may communicate with the host device through the I/O interface 1004. The I/O interface 1004 may include one or more of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), an integrated drive electronics (IDE), and so on.

The electronic system 1000 may be used as an auxiliary storage device of the host device or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A semiconductor device comprising:
a flag signal generation circuit configured to generate a flag signal, the flag signal being enabled in response to an operational frequency information signal that includes information on an operation speed of the semiconductor device; and
a power-down signal generation circuit configured to generate a power-down signal for controlling input of a command based on the flag signal and a clock enablement signal,
wherein a point of time when the power-down signal is generated is adjusted in response to the flag signal.

2. The semiconductor device of claim 1, further comprising an operational frequency information generation circuit configured to detect a frequency of a clock signal provided by an external device during a set time period and to generate the operational frequency information signal based on the detected frequency.

3. The semiconductor device of claim 2, wherein the flag signal is enabled when the frequency of the clock signal corresponds to a high operation speed of the semiconductor device, and disabled when the frequency of the clock signal corresponds to a low operation speed of the semiconductor device.

4. The semiconductor device of claim 1, further comprising an internal circuit configured to receive the command in synchronization with a clock signal to perform an internal operation when the power-down signal is disabled, and interrupt the input of the command when the power-down signal is enabled.

5. The semiconductor device of claim 1, wherein the operational frequency information signal is generated using a mode register set.

6. The semiconductor device of claim 1, wherein the flag signal is enabled when the operation speed of the semiconductor device corresponds to a high operation speed, and disabled when the operation speed of the semiconductor device corresponds to a low operation speed.

7. The semiconductor device of claim 6, wherein the power-down signal generation circuit includes:
a pre-power-down signal generation circuit configured to generate a pre-power-down signal, the pre-power-down signal being generated depending on a level transition of the clock enablement signal, the pre-power-down signal being generated in synchronization with a rising clock signal and a falling clock signal;
a first delay circuit configured to delay the pre-power-down signal by a first delay time period to generate the power-down signal when the flag signal is enabled; and
a second delay circuit configured to delay the pre-power-down signal by a second delay time period to generate the power-down signal when the flag signal is disabled,
wherein the rising clock signal and the falling clock signal are generated by dividing a clock signal.

8. The semiconductor device of claim 1, wherein the power-down signal generation circuit includes:
a pre-power-down signal generation circuit configured to generate a pre-power-down signal which is generated depending on a level transition of the clock enablement signal, the pre-power-down signal being generated in synchronization with a rising clock signal and a falling clock signal;
a signal transmission circuit configured to output the pre-power-down signal as a first transmission signal or a second transmission signal in response to the flag signal;
a first delay circuit configured to delay the first transmission signal by a first delay time period to generate the power-down signal; and
a second delay circuit configured to delay the second transmission signal by a second delay time period to generate the power-down signal,
wherein the rising clock signal and the falling clock signal are generated by dividing a clock signal.

9. The semiconductor device of claim 8, wherein the signal transmission circuit includes:
a first switching circuit configured to output the pre-power-down signal as the first transmission signal when the flag signal is enabled; and
a second switching circuit configured to output the pre-power-down signal as the second transmission signal when the flag signal is disabled.

10. The semiconductor device of claim 1, wherein the power-down signal generation circuit includes:
A pre-power-down signal generation circuit configured to generate a pre-power-down signal, the pre-power-down signal being generated depending on a level transition of the clock enablement signal, the pre-power-down signal being generated in synchronization with a rising clock signal and a falling clock signal;
a first delay circuit configured to delay the pre-power-down signal by a first delay time period to generate a first delay signal;
a second delay circuit configured to delay the pre-power-down signal by a second delay time period to generate a second delay signal; and
a selection/transmission circuit configured to output one of the first and second delay signals as the power-down signal in response to the flag signal,
wherein the rising clock signal and the falling clock signal are generated by dividing a clock signal.

11. A semiconductor device comprising:
a flag signal generation circuit configured to generate first to third flag signals in response to an operational frequency information signal that includes information on an operation speed of the semiconductor device; and
a power-down signal generation circuit configured to generate a power-down signal for controlling input of a command based on the first to third flag signals and a clock enablement signal,
wherein a point of time when the power-down signal is generated is adjusted in response to the first to third flag signals.

12. The semiconductor device of claim 11, further comprising an operational frequency information generation circuit configured to detect a frequency of a clock signal provided by an external device during a set time period and to generate the operational frequency information signal based on the detected frequency.

13. The semiconductor device of claim 11, further comprising an internal circuit configured to receive the command in synchronization with a clock signal to perform an internal operation when the power-down signal is disabled, and to interrupt the input of the command when the power-down signal is enabled.

14. The semiconductor device of claim 11, wherein the operational frequency information signal is generated using a mode register set.

15. The semiconductor device of claim 11,
wherein the first flag signal is enabled when the operation speed of the semiconductor device corresponds to a high operation speed;

wherein the second flag signal is enabled when the operation speed of the semiconductor device corresponds to a normal operation speed; and wherein the third flag signal is enabled when the operation speed of the semiconductor device corresponds to a low operation speed.

16. The semiconductor device of claim 11, wherein the power-down signal generation circuit includes:
    a pre-power-down signal generation circuit configured to generate a pre-power-down signal which is generated depending on level transition of the clock enablement signal, the pre-power-down signal being generated in synchronization with a rising clock signal and a falling clock signal;
    a first delay circuit configured to delay the pre-power-down signal by a first delay time period to output the delayed pre-power-down signal as the power-down signal, in response to the first flag signal;
    a second delay circuit configured to delay the pre-power-down signal by a second delay time period to output the delayed pre-power-down signal as the power-down signal, in response to the second flag signal; and
    a third delay circuit configured to delay the pre-power-down signal by a third delay time period to output the delayed pre-power-down signal as the power-down signal, in response to the third flag signal,
    wherein the rising clock signal and the falling clock signal are generated by dividing a clock signal.

17. The semiconductor device of claim 11, wherein the power-down signal generation circuit includes:
    a pre-power-down signal generation circuit configured to generate a pre-power-down signal which is generated depending on a level transition of the clock enablement signal, the pre-power-down signal being generated in synchronization with a rising clock signal and a falling clock signal;
    a signal transmission circuit configured to output the pre-power-down signal as a first transmission signal in response to the first flag signal, to output the pre-power-down signal as a second transmission signal in response to the second flag signal, and to output the pre-power-down signal as a third transmission signal in response to the third flag signal;
    a first delay circuit configured to delay the first transmission signal by a first delay time period to generate the power-down signal;
    a second delay circuit configured to delay the second transmission signal by a second delay time period to generate the power-down signal; and
    a third delay circuit configured to delay the third transmission signal by a third delay time period to generate the power-down signal,
    wherein the rising clock signal and the falling clock signal are generated by dividing a clock signal.

18. The semiconductor device of claim 17, wherein the signal transmission circuit includes:
    a first switching circuit configured to output the pre-power-down signal as the first transmission signal when the first flag signal is enabled;
    a second switching circuit configured to output the pre-power-down signal as the second transmission signal when the second flag signal is enabled; and
    a third switching circuit configured to output the pre-power-down signal as the third transmission signal when the third flag signal is enabled.

19. The semiconductor device of claim 11, wherein the power-down signal generation circuit includes:
    a pre-power-down signal generation circuit configured to generate a pre-power-down signal which is generated depending on level transition of the clock enablement signal, the pre-power-down signal being generated in synchronization with a rising clock signal and a falling clock signal;
    a first delay circuit configured to delay the pre-power-down signal by a first delay time period to generate a first delay signal;
    a second delay circuit configured to delay the pre-power-down signal by a second delay time period to generate a second delay signal;
    a third delay circuit configured to delay the pre-power-down signal by a third delay time period to generate a third delay signal; and
    a selection/transmission circuit configured to output the first delay signal as the power-down signal in response to the first flag signal, to output the second delay signal as the power-down signal in response to the second flag signal, and to output the third delay signal as the power-down signal in response to the third flag signal,
    wherein the rising clock signal and the falling clock signal are generated by dividing a clock signal.

* * * * *